US012633327B2

(12) United States Patent
Yang et al.

(10) Patent No.: US 12,633,327 B2
(45) Date of Patent: May 19, 2026

(54) DATA PROCESSING SYSTEM, BUFFER CIRCUIT AND METHOD FOR OPERATING BUFFER CIRCUIT

(71) Applicant: Realtek Semiconductor Corporation, Hsinchu (TW)

(72) Inventors: Shan Yuan Yang, Hsinchu (TW); Po-Hsien Wu, Hsinchu (TW); Huan-Wen Chen, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 545 days.

(21) Appl. No.: 17/938,676

(22) Filed: Oct. 7, 2022

(65) Prior Publication Data

US 2023/0162765 A1     May 25, 2023

(30) Foreign Application Priority Data

Nov. 24, 2021   (TW) .................................. 110143818

(51) Int. Cl.
*G11C 7/10* (2006.01)
*G11C 7/22* (2006.01)
(52) U.S. Cl.
CPC .......... *G11C 7/1084* (2013.01); *G11C 7/1096* (2013.01); *G11C 7/222* (2013.01)
(58) Field of Classification Search
CPC ...... G11C 7/1084; G11C 7/1096; G11C 7/222
See application file for complete search history.

(56) References Cited

U.S. PATENT DOCUMENTS

| | | | | |
|---|---|---|---|---|
| 6,640,300 | B1 * | 10/2003 | Raza ................... | G06F 13/4059 711/170 |
| 7,535,789 | B1 * | 5/2009 | Fischaber ............... | G06F 5/065 326/46 |
| 11,683,253 | B2 * | 6/2023 | Tamasi .................. | H04L 65/762 709/224 |
| 2010/0329041 | A1 * | 12/2010 | Sohn .................... | G11C 7/1078 365/189.05 |
| 2013/0107930 | A1 * | 5/2013 | Le Faucheur ......... | H04J 3/0632 375/225 |
| 2016/0035399 | A1 * | 2/2016 | Yaraduyathinahalli .. | G11C 7/22 365/191 |
| 2016/0164665 | A1 * | 6/2016 | Taylor ...................... | G06F 5/12 327/158 |
| 2018/0013689 | A1 * | 1/2018 | Miro Panades ........... | G06F 5/12 |

(Continued)

FOREIGN PATENT DOCUMENTS

| | | |
|---|---|---|
| CN | 111367471 A | 7/2020 |
| JP | 2003224849 A | 8/2003 |

*Primary Examiner* — Nimesh G Patel
(74) *Attorney, Agent, or Firm* — CKC & Partners Co., LLC

(57) ABSTRACT

A buffer circuit including a memory circuit and a control circuit is provided. The memory circuit stores an input data from a data transmitting device, and transmits an output data to a data receiving device. The control circuit computes a remaining data volume of the memory circuit, and generates a control signal according to the remaining data volume. The remaining data volume represents a volume of data to be transmitted which are stored in the memory circuit. The control signal controls the data transmitting device to generate a write clock signal, and the control circuit reduces a frequency of the write clock signal by the control signal when the remaining data volume increases.

20 Claims, 8 Drawing Sheets

(56)     References Cited

U.S. PATENT DOCUMENTS

| | | | |
|---|---|---|---|
| 2018/0373495 A1* | 12/2018 | Strode | ........................ G06F 5/14 |
| 2023/0317138 A1* | 10/2023 | Moon | ................... G11C 11/409 |
| | | | 711/105 |

* cited by examiner w_en r_en w_en w_clk r_en r_clk

Frequency Fe

Frequency Ff

Frequency Fg

Frequency Fh r_GEn

DATA PROCESSING SYSTEM, BUFFER CIRCUIT AND METHOD FOR OPERATING BUFFER CIRCUIT

RELATED APPLICATIONS

This application claims priority to Taiwan Application Serial Number 110143818, filed on Nov. 24, 2021, which is herein incorporated by reference in its entirety.

BACKGROUND

Technical Field

The present disclosure relates to a data processing system, a buffer circuit and an operating method. More particularly, the present disclosure relates to a data processing system and a buffer circuit for preventing voltage ripples and/or current ripples, and to a method for operating the buffer circuit.

Description of Related Art

With the increasingly complex functions of consumer electronic products, it is a common design technique to use a plurality of clock signals for a plurality of circuit blocks in a digital circuit system, that is, these circuit blocks may belong to different clock domains. Data signals are prone to metastable states when they are transmitted between different clock domains. Metastable states may cause the data signals to change to a wrong level during the transmission. To overcome this problem, a buffer circuit can be arranged on a data transmission path that across the clock domains to temporarily store the data signals, so as to ensure that a data receiving end can sample stable data signals. Generally, the buffer circuit may selectively interrupt the data transmitting operation according to remaining memory space thereof. However, the sudden interruption of the circuit operation will cause the power to change drastically and easily cause voltage ripples and/or current ripples.

SUMMARY

The disclosure provides a buffer circuit including a memory circuit and a control circuit. The memory circuit is configured to store an input data from a data transmitting device, and configured to transmit an output data to a data receiving device. The control circuit is configured to compute a remaining data volume of the memory circuit, and configured to generate a control signal according to the remaining data volume. The remaining data volume is indicative of a volume of data to be transmitted which are stored in the memory circuit. The control signal is configured to control the data transmitting device to generate a write clock signal, and the control circuit reduces a frequency of the write clock signal by the control signal when the remaining data volume increases.

The disclosure provides a method for operating a buffer circuit, which includes the following operations: storing an input data of a data transmitting device in a memory circuit, and transmitting an output data to a data receiving device from the memory circuit; computing a remaining data volume of the memory circuit, wherein the remaining data volume is indicative of a volume of data to be transmitted which are stored in the memory circuit; and generating a control signal according to the remaining data volume, including: when the control signal is configured to control the data transmitting device to generate a write clock signal, reducing a frequency of the write clock signal by the control signal when the remaining data volume increases; and when the control signal is configured to control the data receiving device to generate a read clock signal, reducing a frequency of the read clock signal by the control signal when the remaining data volume decreases.

The disclosure provides a buffer circuit including a memory circuit and a control circuit. The memory circuit is configured to store an input data from a data transmitting device, and configured to transmit an output data to a data receiving device. The control circuit is configured to compute a remaining data volume of the memory circuit, and configured to generate a control signal according to the remaining data volume. The remaining data volume is indicative of a volume of data to be transmitted which are stored in the memory circuit. The control signal is configured to control the data receiving device to generate a read clock signal, and the control circuit reduces a frequency of the read clock signal by the control signal when the remaining data volume decreases.

One of the advantages of the above buffer circuit, method and data processing system is to prevent voltage ripples and/or current ripples.

It is to be understood that both the foregoing general description and the following detailed description are by examples, and are intended to provide further explanation of the disclosure as claimed.

DETAILED DESCRIPTION

Figure 1:
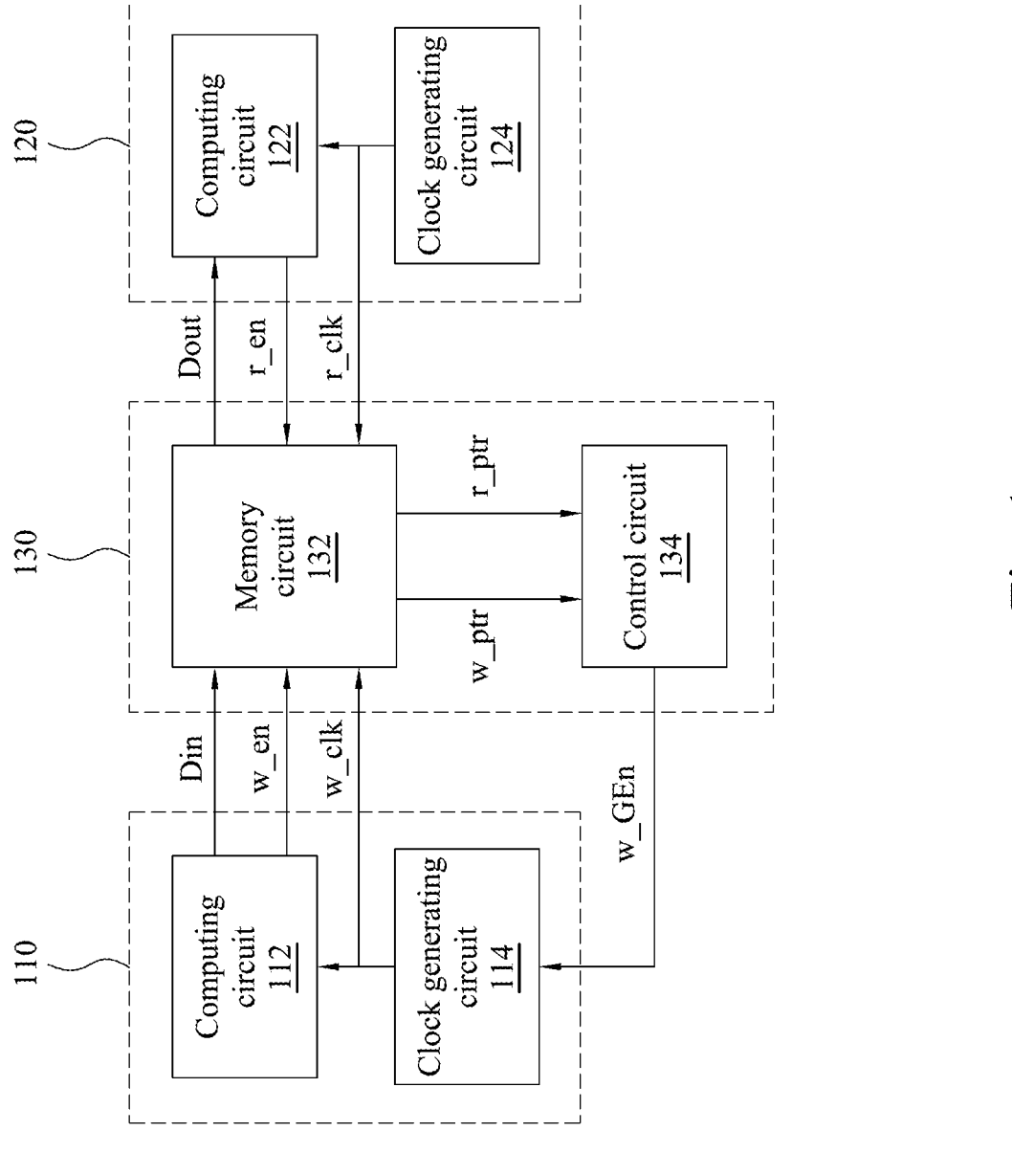
FIG. 1 is a simplified functional block diagram of a data processing system according to an embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a simplified functional block diagram of a data processing system 100 according to an embodiment of the present disclosure. Reference is made to FIG. 1, in which the data processing system 100 comprises a data transmitting device 110, a data receiving device 120 and a buffer circuit 130. The data transmitting device 110 and the data receiving device 120 belong to different clock domains, so that a data transmission between the two devices is asynchronous. The buffer circuit 130 is coupled between the data transmitting device 110 and the data receiving device 120, and configured to temporarily store data transmitted by the data transmitting device 110 to the data receiving device 120, so as to realize a clock domain crossing (CDC) data transmission. In some embodiments, the data transmitting device 110 and the data receiving device 120 may belong to the same clock domain and perform an asynchronous data transmission.

The data transmitting device 110 comprises a computing circuit 112 and a clock generating circuit 114. For the sake of brevity, other functional blocks and connection relationships of the data transmitting device 110 are not shown in FIG. 1. The computing circuit 112 is configured to transmit an input data Din and a write-enable signal w_en to the buffer circuit 130. The write-enable signal w_en is configured to control the buffer circuit 130 to conduct a write operation to store the input data Din. The clock generating circuit 114 is configured to generate a write clock signal w_clk. The write clock signal w_clk is configured to control operations of other functional blocks in the data transmitting device 110. In some embodiments, when the write clock signal w_clk stops oscillating, except the clock generating circuit 114, the other functional blocks in the data transmitting device 110 stop operating. For example, data throughput of the computing circuit 112 when transmitting the input data Din may be positively correlated to a frequency of the write clock signal w_clk, and the computing circuit 112 may stop transmitting the input data Din when the write clock signal w_clk stops oscillating. The data throughput of the computing circuit 112 may be an average volume of the input data Din transmitted by the computing circuit 112 in a unit of time. For the convenience of explanation, the data throughput of the computing circuit 112 is referred to as "data throughput of the data transmitting device 110" in some paragraphs of this disclosure. In some embodiments, the computing circuit 112 may be implemented by a direct memory access (DMA) controller, or by a combination of the DMA controller and a video processing chip so as to provide video data as the input data Din to the buffer circuit 130, but this disclosure is not limited thereto.

The data receiving device 120 comprises a computing circuit 122 and a clock generating circuit 124. For the sake of brevity, other functional blocks and connection relationships of the data receiving device 120 are not shown in FIG. 1. The computing circuit 122 is configured to receive the output data Dout from the buffer circuit 130, and configured to provide a read-enable signal r_en to the buffer circuit 130. The read-enable signal r_en is configured to control the buffer circuit 130 to conduct a read operation to provide an output data Dout to the computing circuit 122. The clock generating circuit 124 is configured to generate a read clock signal r_clk. The read clock signal r_clk is configured to control operations of other functional blocks of the data receiving device 120. In some embodiments, when the read clock signal r_clk stops oscillating, except the clock generating circuit 124, the other functional blocks of the data receiving device 120 stop operating. For example, data throughput of the computing circuit 122 when receiving the output data Dout may be positively correlated with a frequency of the read clock signal r_clk, and the computing circuit 122 may stop receiving the output data Dout when the read clock signal r_clk stops oscillating. The data throughput of the computing circuit 122 may be an average volume of the output data Dout received by the computing circuit 122 in a unit of time. For the convenience of explanation, the data throughput of the computing circuit 122 is referred to as "data throughput of the data receiving device 120" in some paragraphs of this disclosure. In some embodiments, the computing circuit 122 may be implemented by a timing controller (TCON). The timing controller is configured to control a display panel (not shown in FIG. 1) to display corresponding images according to the output data Dout, but this disclosure is not limited thereto.

The buffer circuit 130 comprises a memory circuit 132 and a control circuit 134. The memory circuit 132 is configured to conduct the write operation according to the write-enable signal w_en and the write clock signal w_clk, and configured to conduct the read operation according to the read-enable signal r_en and the read clock signal r_clk. In some embodiments, the memory circuit 132 may be implemented by a first-in-first-out (FIFO) memory circuit. The control circuit 134 is configured to generate a control signal w_GEn according to a remaining data volume of the memory circuit 132. The remaining data volume of the memory circuit 132 is indicative of a volume of data temporarily stored in the memory circuit 132 and to be transmitted to the data receiving device 120. In some embodiments, the control circuit 134 may receive a write pointer w_ptr and a read pointer r_ptr of the memory circuit 132, and subtract the read pointer r_ptr from the write pointer w_ptr to obtain the remaining data volume. The control signal w_GEn is configured to control the clock generating circuit 114 to generate the write clock signal w_clk having specified frequencies. As aforementioned, the data throughput of the computing circuit 122 is positively correlated with the frequency of the write clock signal w_clk, and therefore by controlling the frequency of the write clock signal w_clk, the control circuit 134 can control the data throughput of the computing circuit 122. In some embodiments, the control signal w_GEn is configured to disable the write clock signal w_clk.

Figure 2:
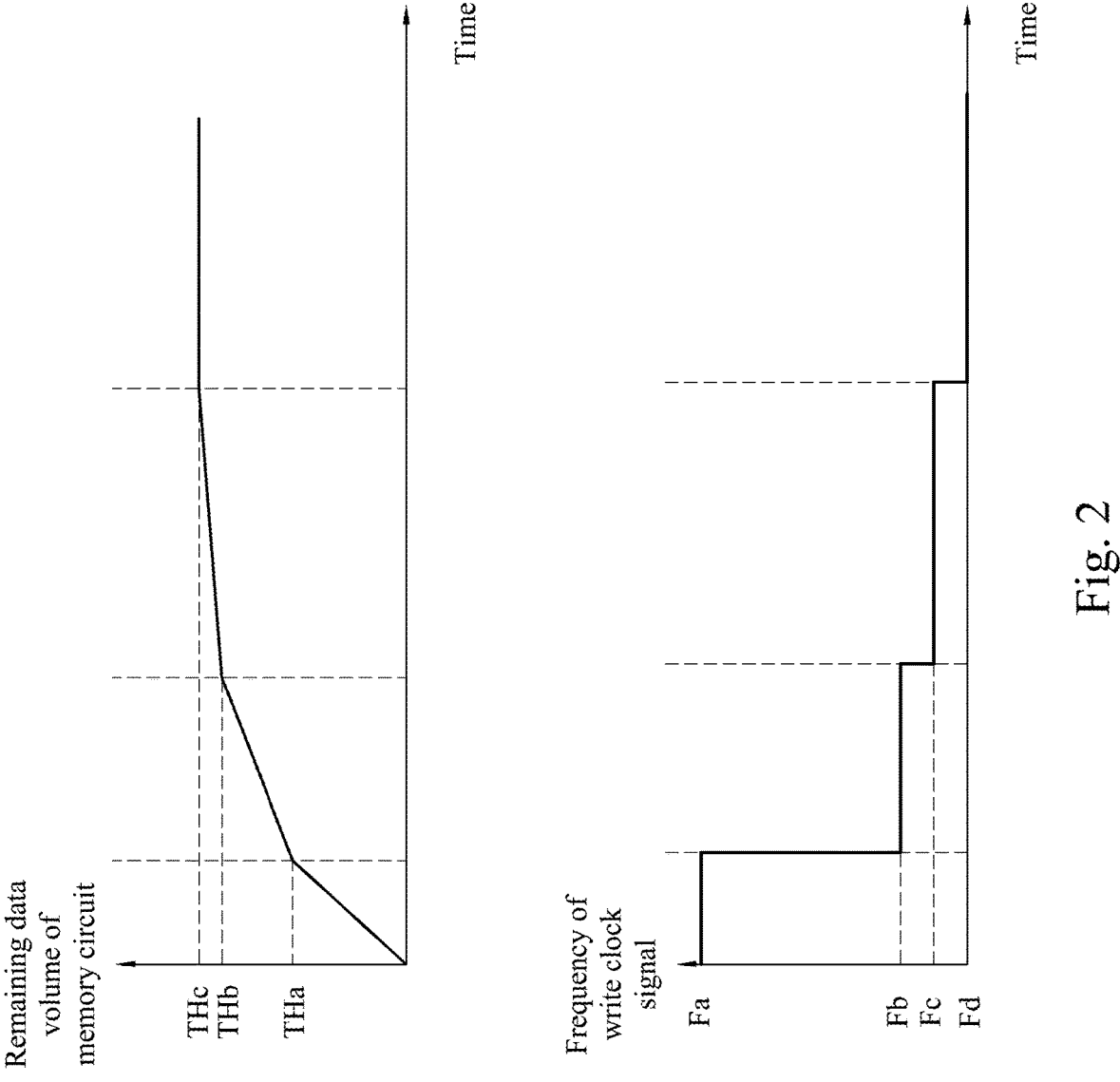
FIG. 2 shows schematic diagrams of the remaining data volume of the buffer circuit and the frequencies of the write clock signal, according to an embodiment of the present disclosure.

FIG. 2 shows schematic diagrams of the remaining data volume of the buffer circuit 130 and the frequencies of the write clock signal w_clk, according to an embodiment of the present disclosure. Reference is made to FIG. 1 and FIG. 2, in which the control circuit 134 is configured to compare the remaining data volume with a plurality of different threshold values THa-THc of FIG. 2. In some embodiments, the threshold values THa-THc are 50%, 70% and 90% of an effective capacity of the memory circuit 132, respectively, but this disclosure is not limited thereto. The control circuit 134 may adjust a waveform of the control signal w_GEn (e.g., to adjust a pulse width and/or a duty cycle) according to the comparison result, so that the frequency of the write clock signal w_clk varies with the remaining data volume. For example, when the remaining data volume of the memory circuit 132 increases from lower than the threshold value THa to reach the threshold value THa, the control circuit 134 may switch the write clock signal w_clk from a frequency Fa to a frequency Fb; when the remaining data volume of the memory circuit 132 decreases from between the threshold values THa and THb to lower than the threshold value THa, the control circuit 134 may switch the write clock signal w_clk from the frequency Fb to the frequency Fa, and so forth. A relationship between a waveform of the control signal w_GEn and the frequency of the write clock signal w_clk will be further described with reference to FIG. 3 and FIG. 4 in the following paragraphs.

As can be seen in FIG. 2, the control circuit 134 set the frequency of the write clock signal w_clk approximately negatively correlated with the remaining data volume of the memory circuit 132. In some embodiments, the frequency Fa may be an original frequency of the write clock signal w_clk that is free from being restricted by any manner; the frequency Fb may be 25% of the frequency Fa; a frequency Fc may be 12.5% of the frequency Fa; and a frequency Fd may be 0% of the frequency Fa, which represents that the write clock signal w_clk stops oscillating to completely suspend the transmission of the input data Din, but this disclosure is not limited thereto. By adaptively adjusting the frequency of the write clock signal w_clk, even if the data transmission between the data transmitting device 110 and the data receiving device 120 is asynchronous (e.g., the transmission of the input data Din by the data transmitting device 110 is before the reception of the output data Dout by the data receiving device 120, or the data throughput of the data transmitting device 110 that is free from being restricted by any manner is greater than the data throughput of the data receiving device 120), the memory space of the memory circuit 132 would not run out so as to ensure that there are no data loss during the data transmission between the data transmitting device 110 and the data receiving device 120. Adaptively adjustment to the frequency of the write clock signal w_clk by the data processing system 100 will be discussed with reference to FIG. 3 and FIG. 4.

Figure 3:
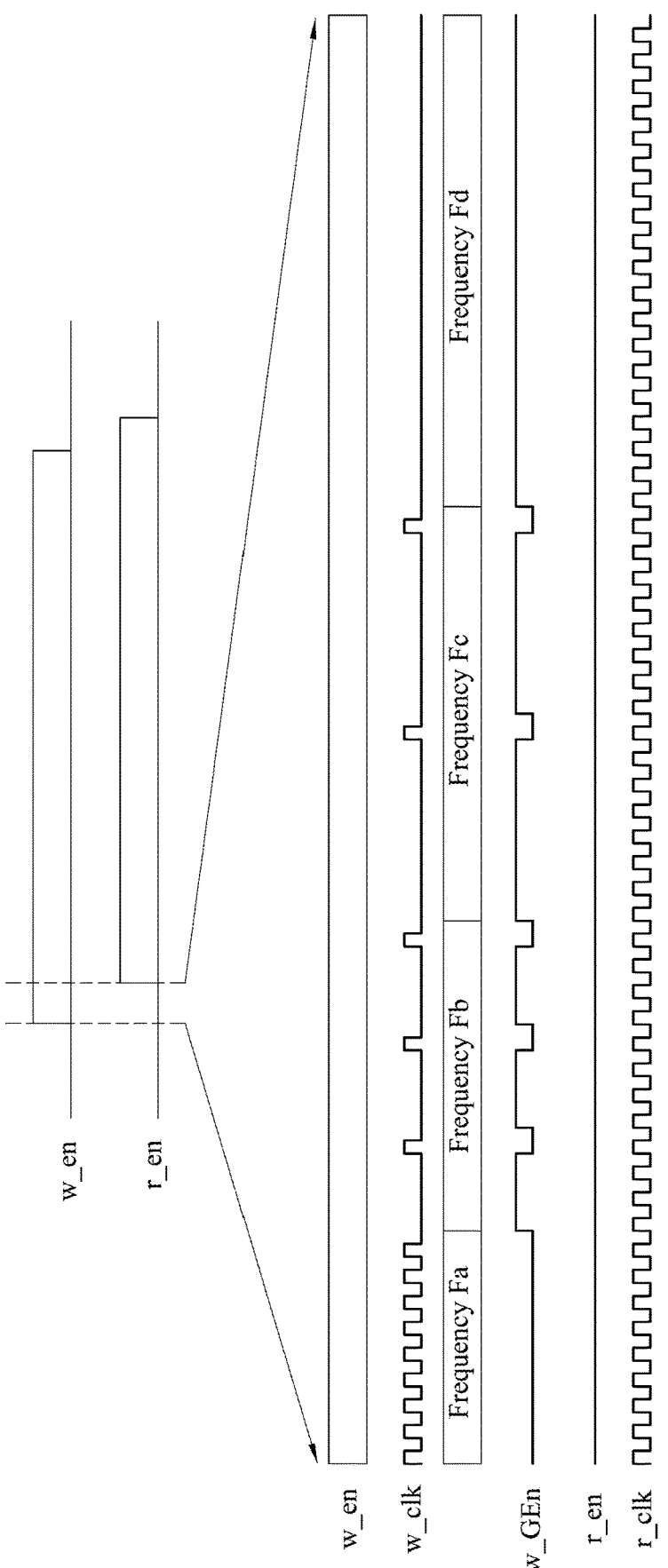
FIG. 3 is a timing diagram of the data processing system according to an embodiment of the present disclosure.
Figure 4:
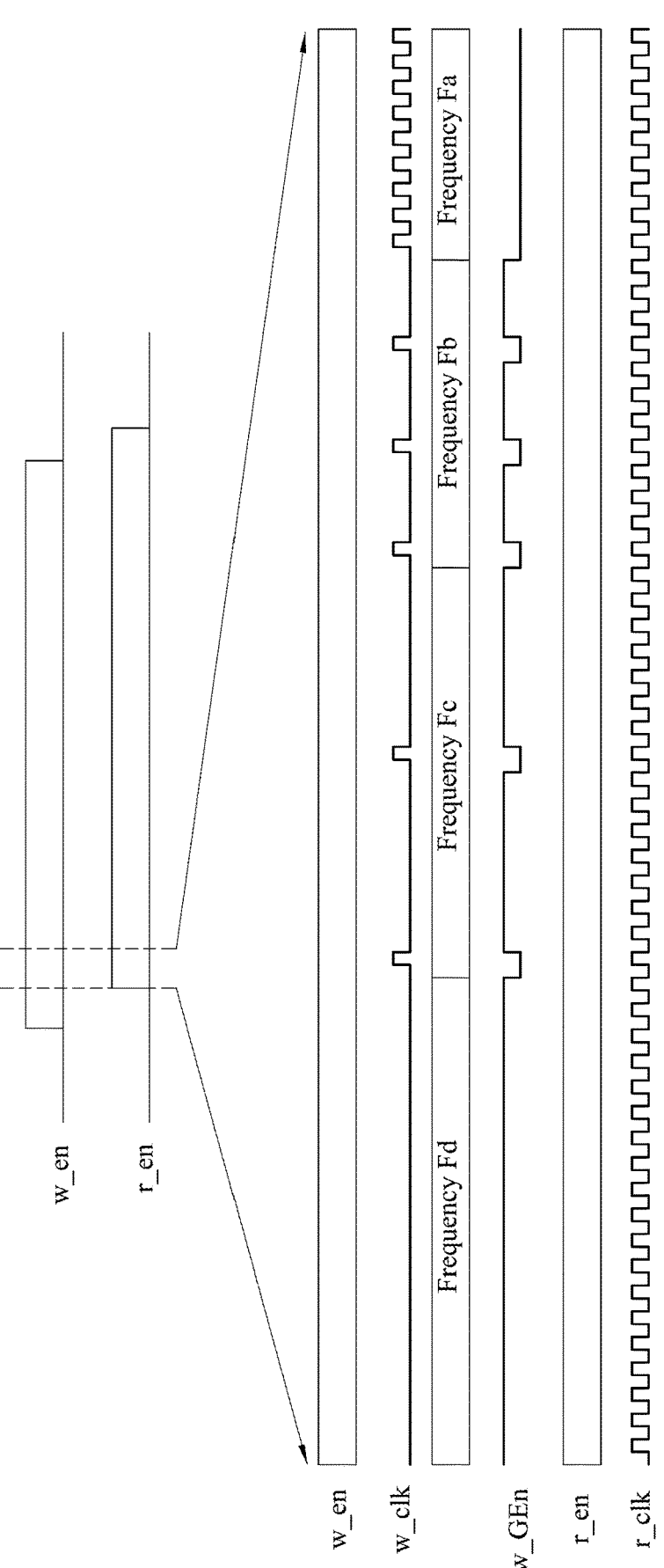
FIG. 4 is a timing diagram of the data processing system according to another embodiment of the present disclosure.

FIG. 3 is a timing diagram of the data processing system 100 according to an embodiment of the present disclosure. FIG. 4 is a timing diagram of the data processing system 100 according to another embodiment of the present disclosure. In each of the FIG. 3 and FIG. 4, a lower-half portion of the figure is an enlarged timing diagram of an upper-half portion of the figure. The timing diagram of FIG. 4 is subsequent to the timing diagram of FIG. 3. Reference is first made to FIG. 1 and FIG. 3, in which the write-enable signal w_en and the read-enable signal r_en of FIG. 3 have logic high level and logic low level, respectively, which indicates that the data transmitting device 110 is transmitting the input data Din, while the data receiving device 120 not start to receive the output data Dout yet. Therefore, the remaining data volume of the memory circuit 132 gradually increases in the embodiment of FIG. 3.

When the remaining data volume is lower than the threshold value THa, the memory circuit 132 still has sufficient memory space and the control circuit 134 may set the write clock signal w_clk to frequency Fa, that is, the original frequency of the write clock signal w_clk. To realize this configuration, the control circuit 134 may keep the control signal w_Gen at the logic low level. That is, the control signal w_Gen has a duty cycle of 0%. The control signal w_Gen of the logic low level allows the clock generating circuit 114 to generate the write clock signal w_clk, while the control signal w_Gen of the logic high level makes the clock generating circuit 114 stop generating the write clock signal w_clk (i.e., to make the write clock signal w_clk stops oscillating). The computing circuit 122 is controlled by the write clock signal w_clk having the frequency Fa, and therefore transmits the input data Din by the data throughput that is free from being restricted by any manner (hereinafter referred to as "original data throughput").

Then, if the remaining data volume increases to reach to the threshold value THa, the control circuit 134 may set the write clock signal w_clk to frequency Fb to reduce the data throughput of the computing circuit 122. To realize this configuration, the control circuit 134 may set the control signal w_Gen to have periodical pulses, that is, the control circuit 134 may periodically disable the clock generating circuit 114 from generating the write clock signal w_clk so as to reduce the frequency of the write clock signal w_clk. Specifically, the frequency of the control signal w_Gen may be 25% of the frequency Fa, and the logic high level and the logic low level of the control signal w_Gen occupy 75% and 25% of a period thereof, respectively. That is, the control signal w_Gen has a duty cycle of 75%. As a result, the data throughput of the computing circuit 112 decreases to 25% of the original data throughput.

When the remaining data volume continuously rising to reach the threshold value THb, the control circuit 134 may further increase the pulse width of the control signal w_Gen to set the write clock signal w_clk to frequency Fc, so as to further reduce the data throughput of the computing circuit 112. In this situation, the frequency of the control signal w_Gen may be 12.5% of the frequency Fa, and the logic high level and the logic low level of the control signal w_Gen occupy 87.5% and 12.5% of a period thereof, respectively. That is, the control signal w_Gen has a duty cycle of 87.5%. As a result, the data throughput of the computing circuit 112 reduces to 12.5% of the original data throughput. If the remaining data volume of the memory circuit 132 further increases to reach the maximum threshold value THc, the control circuit 134 may keep the control signal w_Gen at the logic high level. That is, the control signal w_Gen has a duty cycle of 100%. In this situation, the write clock signal w_clk has the frequency Fd (i.e., stop oscillating), and the computing circuit 112 completely suspends the transmission of the input data Din.

As can be appreciated from the above, when the remaining data volume of the memory circuit 132 increases, the control circuit 134 may increases the pulse width and the duty cycle of the control signal w_GEn for multiple times to decrease the frequency of the write clock signal w_clk for multiple times, so as to decrease the data throughput of the computing circuit 112 for multiple times.

Reference is made to FIG. 1, FIG. 2 and FIG. 4. In the embodiment of FIG. 4, the read-enable signal r_en is switched from the logic low level to the logic high level, which represents that the data receiving device 120 starts to receive the output data Dout from the memory circuit 132 so that the remaining data volume of the memory circuit 132 gradually decreases. The control circuit 134 may successively decrease the pulse width and the duty cycle of the control signal w_GEn when the remaining data volume of the memory circuit 132 decreases, so as to successively increase the frequency of the write clock signal w_clk, and to successively increase the data throughput of the computing circuit 112. A person of ordinary skill in the art may, in light of the discussion with respect to FIG. 3, understand the means of increasing the frequency of the write clock signal w_clk by adjusting the waveform of the control signal w_GEn. For the sake of brevity, those descriptions are omitted here.

Figure 5:
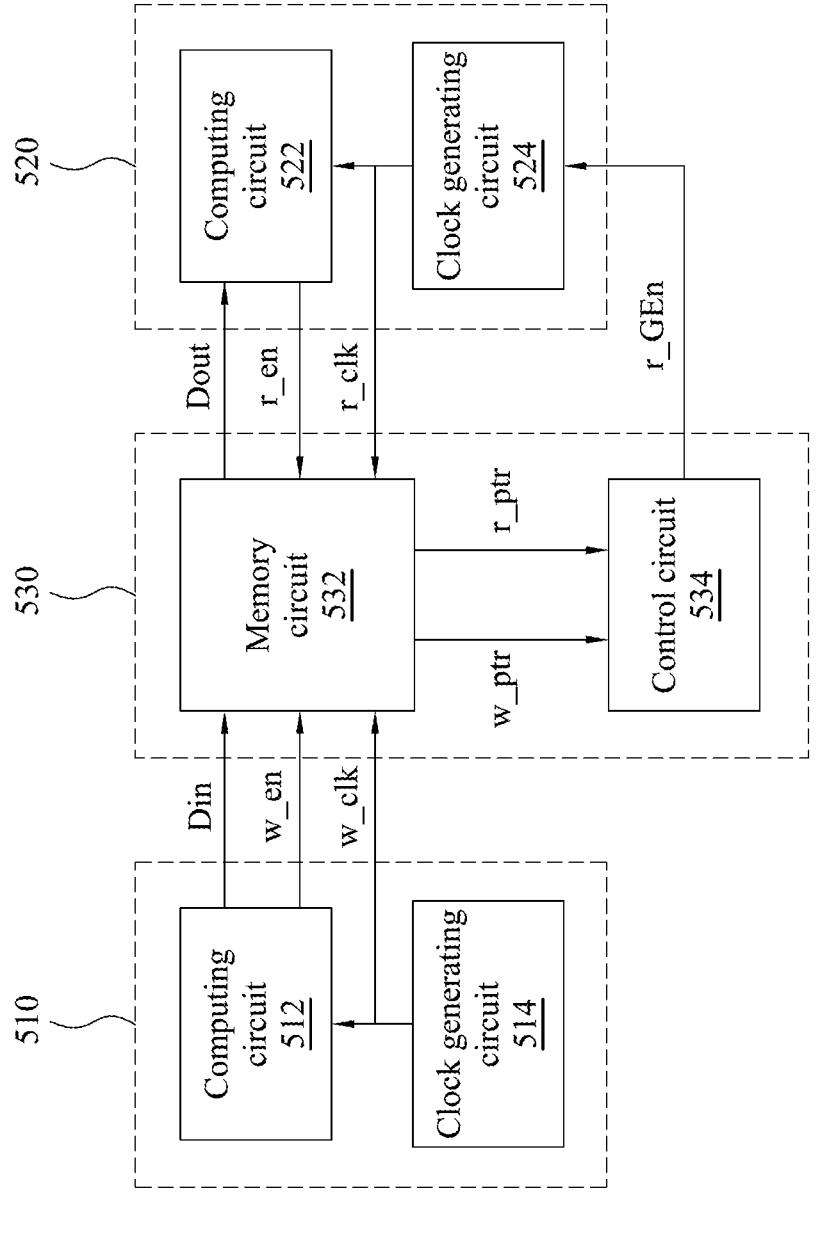
FIG. 5 is a simplified functional block diagram of a data processing system according to one embodiment of the present disclosure.

FIG. 5 is a simplified functional block diagram of a data processing system 500 according to one embodiment of the present disclosure. The data processing system 500 comprises a data transmitting device 510, a data receiving device 520 and a buffer circuit 530. In structure, the data transmitting device 510 comprises a computing circuit 512 and a clock generating circuit 514; the data receiving device 520 comprises a computing circuit 522 and a clock generating circuit 524; the buffer circuit 530 comprises a memory circuit 532 and a control circuit 534. In some embodiments, the data transmitting device 510 may be implemented by any suitable real-time computing semiconductor intellectual property (SIP) core. The data receiving device 520 may be implemented by a DMA controller. As shown in FIG. 5, connection relationships between functional blocks of the data processing system 500 are similar to those discussed with respect to the data processing system 100 of FIG. 1, and those descriptions are omitted for the sake of brevity. In addition, the data processing system 500 is similar to the data processing system 100 of FIG. 1 in operation, and thus only the differences are discussed in the following paragraphs.

In this embodiment, since the data transmitting device 510 and the data receiving device 520 belong to different clock domains, data transmission between the two devices is asynchronous. The said asynchronous data transmission may be that a data throughput of the data receiving device 520 that is free from being restricted by any manner is greater than a data throughput of the data transmitting device 510. In some embodiments, the data transmitting device 510 and the data receiving device 520 belong to the same clock domain and perform asynchronous data transmission. The control circuit 534 of the buffer circuit 530 is configured to generate a control signal r_GEn. The control signal r_GEn is configured to control the clock generating circuit 524 to generate a read clock signal r_clk having specified frequencies. By controlling the frequency of the read clock signal r_clk, the control circuit 534 can control the data throughput of the computing circuit 522 of the data receiving device 520. In some embodiments, the control signal r_GEn is configured to disable the read clock signal r_clk.

Figure 6:
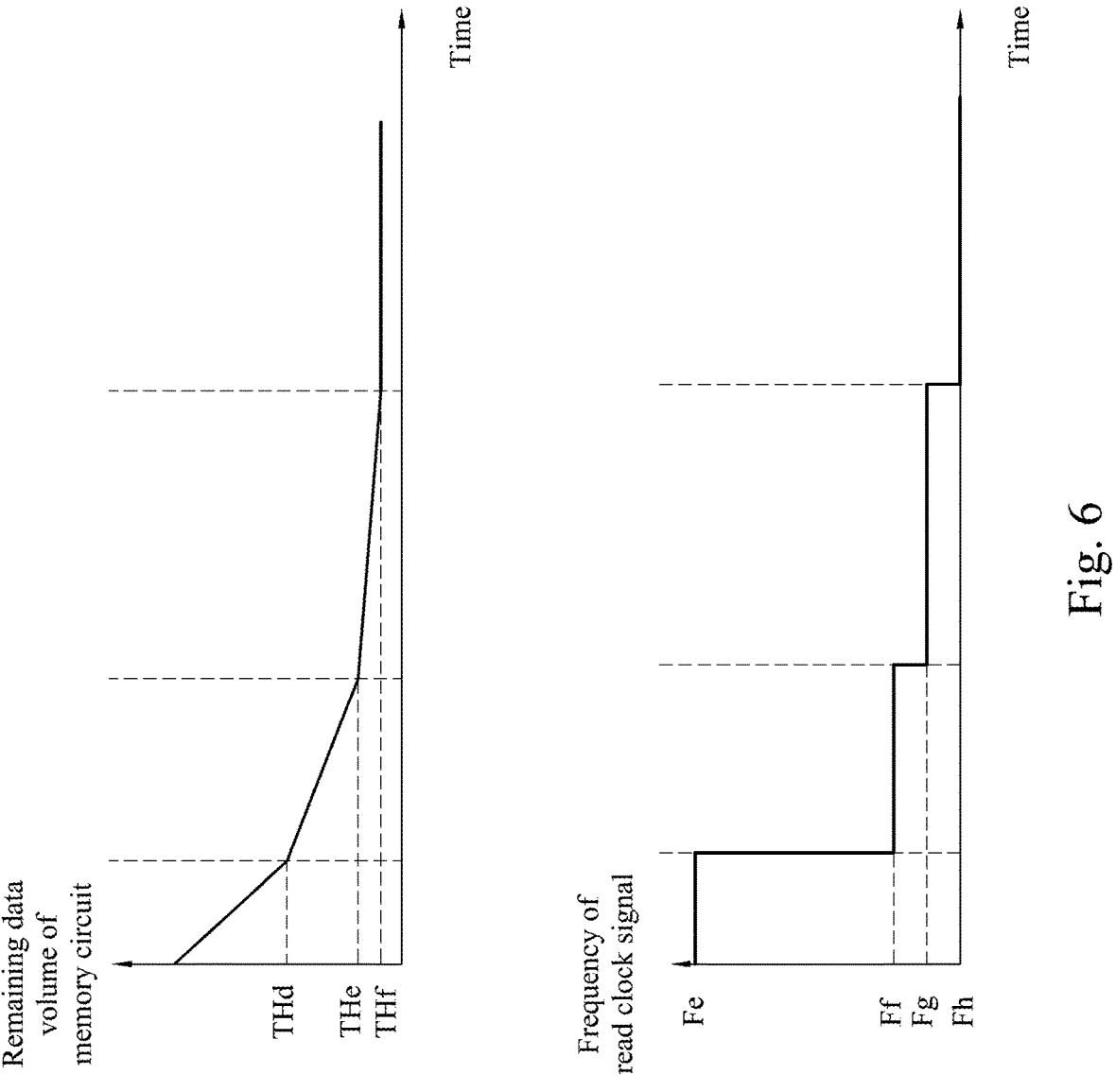
FIG. 6 shows schematic diagrams of a remaining data volume of the buffer circuit and frequencies of the read clock signal, according to an embodiment of the present disclosure.

FIG. 6 shows schematic diagrams of a remaining data volume of the buffer circuit 530 and frequencies of the read clock signal r_clk, according to an embodiment of the present disclosure. Reference is made to FIG. 5 and FIG. 6, in which the control circuit 534 is configured to compare the remaining data volume with a plurality of different threshold values THd-THf of FIG. 5. In some embodiments, the threshold values THd-THf are 50%, 30% and 10% of an effective capacity of the memory circuit 532, respectively, but this disclosure is not limited thereto. The control circuit 534 may adjust a waveform of the control signal r_GEn (e.g., adjusting a pulse width and/or a duty cycle) according to the comparison result, so that the frequency of the read clock signal r_clk varies with the remaining data volume.

As shown in FIG. 6, the control circuit 534 may set the frequency of the read clock signal r_clk to be approximately positively correlated with the remaining data volume. That is, with the gradual decrease of the remaining data volume, the control circuit 534 may set the frequency of the read clock signal r_clk successively to frequencies Fe-Fh arranged from high to low. In some embodiments, the frequency Fe may be an original frequency of the read clock signal r_clk that is free from being restricted by any manner; the frequency Ff may be 25% of the frequency Fe; the frequency Fg may be 12.5% of the frequency Fe; and the frequency Fh may be 0% of the frequency Fe, which represents that the read clock signal r_clk stops oscillating to suspend the transmission of the output data Dout, but this disclosure is not limited thereto. By adaptively adjust the frequency of the read clock signal r_clk, even if the data transmission between the data transmitting device 510 and the data receiving device 520 is asynchronous, the remaining data volume of the memory circuit 532 would not run out to ensure that no erroneous output data Dout is received by the data receiving device 520. Adaptively adjustment to the frequency of the read clock signal r_clk by the data processing system 500 will be described with reference to FIG. 7 and FIG. 8.

Figure 7:
FIG. 7 is a timing diagram of the data processing system according to an embodiment of the present disclosure.
Figure 8:
FIG. 8 is a timing diagram of the data processing system according to another embodiment of the present disclosure.

FIG. 7 is a timing diagram of the data processing system 500 according to an embodiment of the present disclosure. FIG. 8 is a timing diagram of the data processing system 500 according to another embodiment of the present disclosure.

In each of the FIG. 7 and FIG. 8, a lower-half portion of the figure is an enlarged timing diagram of an upper-half portion of the figure. The timing diagram of FIG. 8 is subsequent to the timing diagram of FIG. 7. Reference is first made to FIG. 5 and FIG. 7, in which the write-enable signal w_en and the read-enable signal r_en of FIG. 7 have the logic high level, which represents that the data transmitting device 510 is transmitting the input data Din and the data receiving device 520 is receiving the output data Dout. However, the data throughput of the data receiving device 520 that is free from being restricted by any manner is greater than the data throughput of the data transmitting device 510, and therefore the remaining data volume of the memory circuit 532 gradually decreases in the embodiment of FIG. 7.

When the remaining data volume is higher than the threshold value THd, the control circuit 134 may set the write clock signal w_clk to frequency Fa, that is, the original frequency of the read clock signal r_clk that is free from being restricted by any manner. To realize this configuration, the control circuit 534 keeps the control signal r_GEn at the logic low level. That is, the control signal r_GEn has a duty cycle of 0%. The control signal r_GEn of logic low level allows the clock generating circuit 524 to generate the read clock signal r_clk, while the control signal r_GEn of logic high level makes the clock generating circuit 524 stop generating the read clock signal r_clk (i.e., to make the read clock signal r_clk stop oscillating). The computing circuit 522 is controlled by the read clock signal r_clk having the frequency Fa, and therefore receives the output data Dout by the data throughput that is free from being restricted by any manner (hereinafter referred to as "original data throughput").

Then, if the remaining data volume decreases to reach the threshold value THd, the control circuit 534 may set the read clock signal r_clk to frequency Ff to reduce the data throughput of the computing circuit 522. To realize this configuration, the control circuit 534 may set the control signal r_GEn to have periodical pulses, that is, the control circuit 534 may periodically disable the clock generating circuit 524 from generating the read clock signal r_clk to decrease the frequency of the read clock signal r_clk. In specific, the frequency of the control signal r_GEn may be 25% of the frequency Fe, and the logic high level and the logic low level of the control signal r_GEn occupy 75% and 25% of a period thereof. That is, the control signal r_GEn has a duty cycle of 75%. As a result, the data throughput If the remaining data volume continuously decreases to reach the threshold value THe. The control circuit 534 may further increases the pulse width of the control signal r_GEn to set the read clock signal r_clk to frequency Fg to further reduce the data throughput of the computing circuit 522. In this situation, the frequency of the control signal r_GEn may be 12.5% of the frequency Fe, and the logic high level and the logic low level of the control signal r_GEn may occupy 87.5% and 12.5% of a period thereof. That is, the control signal r_GEn has a duty cycle of 87.5%. As a result, the data throughput of the computing circuit 522 decreases to 12.5% of the original data throughput. If the remaining data volume of the memory circuit 532 further decreases to reach the minimum threshold value THf, the control circuit 134 may keep the control signal r_GEn at the logic high level, that is, the control signal r_GEn has a duty cycle of 100%. In this situation, the read clock signal r_clk may have the frequency Fh (i.e., stop oscillating), and the computing circuit 522 completely suspend transmission of the output data Dout.

As can be appreciated from the above, when the remaining data volume of the memory circuit 532 decreases, the control circuit 534 may increase the pulse width and the duty cycle of the control signal r_GEn for multiple times to decrease the frequency of the read clock signal r_clk for multiple times, so as to reduce the data throughput of the computing circuit 522 for multiple times.

Reference is made to FIG. 5, FIG. 6 and FIG. 8. Since the transmission process of the output data Dout is stopped at the beginning of the timing sequence of FIG. 8, the remaining data volume of the memory circuit 532 gradually increases. The control circuit 534 may successive decrease the pulse width and the duty cycle of the control signal r_GEn when the remaining data volume of the memory circuit 532 increases, so as to successively increase the frequency of the read clock signal r_clk, and to successively increase the data throughput of the computing circuit 522. A person of ordinary skill in the art may, in light of the discussion with respect to FIG. 7, understand the means of increasing the frequency of the read clock signal r_clk by adjusting the waveform of the control signal r_GEn. For the sake of brevity, those descriptions are omitted here.

In the above embodiments, by gradually adjusting the frequencies of the write clock signal w_clk and the read clock signal r_clk, power consumption of the data transmitting device 110 of FIG. 1 and the data receiving device 520 of FIG. 5 is changed gradually. This can help to prevent voltage ripples and/or current ripples to occur in the data transmitting device 110 of FIG. 1 and the data receiving device 520 of FIG. 5. In other words, the above embodiments can improve circuit reliability. Notably, a total number and values of the threshold values THa-THc, a total number and values of the threshold values THd-THf, a total number of the frequencies Fa-Fd and a total number of the frequencies Fe-Fh are merely exemplary embodiments and can be adjusted according to practical design requirements. For example, increasing the number of the threshold values is help to further reduce the power fluctuation of the circuit, while reducing the number of the threshold values is help to prevent the power of the circuit being frequently switched to improve the stability. As another example, when designing the frequency of the write clock signal w_clk of each stage, the data throughput of the computing circuit 112 and the effective capacity of the memory circuit 132 may be involved into consideration so that the write clock signal w_clk having the reduced frequency can effectively mitigate the rising speed of the remaining data volume of the memory circuit 132. As yet another example, when designing the frequency of the read clock signal r_clk of each stage, the data throughput of the computing circuit 522 and the effective capacity of the memory circuit 532 may be involved into consideration so that the read clock signal r_clk having the reduced frequency can effectively mitigate the falling speed of the remaining data volume of the memory circuit 532.

Certain terms are used throughout the description and claims to refer to particular components. A person of ordinary skill in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

The term "and/or" may comprise any and all combinations of one or more of the associated listed items. In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A buffer circuit, comprising:
a memory circuit, configured to store an input data from a data transmitting device, configured to transmit an output data to a data receiving device, and configured to receive a read-enable signal from the data receiving device; and
a control circuit, configured to compute a remaining data volume of the memory circuit, and configured to generate a control signal having periodical pulses according to the remaining data volume, wherein the remaining data volume is indicative of a volume of data to be transmitted which are stored in the memory circuit,
wherein the control signal is configured to control the data transmitting device to generate a write clock signal;
wherein in response to the read-enable signal having a first logic level, the control circuit is configured to periodically disable a clock generating circuit of the data transmitting device by the control signal from generating the write clock signal so as to gradually reduce a frequency of the write clock signal when the remaining data volume increases from a first threshold value to a second threshold value, thereby gradually adjusting the frequency of the write clock signal from a first frequency to a second frequency.

2. The buffer circuit of claim 1, wherein the control signal is configured to disable the data transmitting device from generating the write clock signal, and the control circuit increases a duty cycle of the control signal when the remaining data volume increases.

3. The buffer circuit of claim 1, wherein the memory circuit conducts a write operation to store the input data according to the write clock signal of the data transmitting device.

4. The buffer circuit of claim 1, wherein the control signal is configured to disable the data transmitting device from generating the write clock signal, and the control circuit is configured to compare the remaining data volume with a plurality of different third threshold values, wherein the control circuit increases a pulse width of the control signal when the remaining data volume increases to reach one of the plurality of third threshold values, wherein the control circuit sets a duty cycle of the control signal to 100% when the remaining data volume increases to reach a maximum one of the plurality of third threshold values.

5. The buffer circuit of claim 1, wherein the data transmitting device and the data receiving device belong to different clock domains.

6. The buffer circuit of claim 1, wherein the data transmitting device and the data receiving device belong to a same clock domain, and the data transmitting device and the data receiving device conduct an asynchronous data transmission.

7. The buffer circuit of claim 1, wherein the memory circuit has a write pointer and a read pointer, and the control circuit subtracts the read pointer from the write pointer to obtain the remaining data volume.

8. The buffer circuit of claim 1, wherein the memory circuit is a first-in-first-out (FIFO) memory circuit.

9. A method for operating a buffer circuit, comprising:

storing an input data of a data transmitting device in a memory circuit so as to transmit an output data to a data receiving device from the memory circuit;

receiving a read-enable signal from the data receiving device;

computing a remaining data volume of the memory circuit, wherein the remaining data volume is indicative of a volume of data to be transmitted which are stored in the memory circuit; and generating a control signal having periodical pulses according to the remaining data volume, comprising:

when the control signal is configured to control the data transmitting device to generate a write clock signal, in response to the read-enable signal having a first logic level, periodically disabling a clock generating circuit of the data transmitting device by the control signal from generating the write clock signal so as to gradually reduce a frequency of the write clock signal when the remaining data volume increases from a first threshold value to a second threshold value, thereby gradually adjusting the frequency of the write clock signal from a first frequency to a second frequency; and when the control signal is configured to control the data receiving device to generate a read clock signal, in response to the read-enable signal having a second logic level, periodically disabling a clock generating circuit of the data receiving device by the control signal from generating the read clock signal so as to gradually reduce a frequency of the read clock signal when the remaining data volume decreases from a third threshold value to a forth threshold value, thereby gradually adjusting the frequency of the read clock signal from a third frequency to a forth frequency.

10. The method of claim 9, wherein generating the control signal according to the remaining data volume comprises:

adjusting a duty cycle of the control signal according to the remaining data volume;

when the control signal is configured to disable the data transmitting device from generating the write clock signal, increasing the duty cycle of the control signal when the remaining data volume increases; and when the control signal is configured to disable the data receiving device from generating the read clock signal, increasing the duty cycle of the control signal when the remaining data volume decreases.

11. The method of claim 9, wherein the memory circuit conducts a write operation to store the input data according to the write clock signal of the data transmitting device, and the memory circuit conducts a read operation to transmit the output data to the data receiving device according to the read clock signal of the data receiving device.

12. The method of claim 9, wherein the control signal is configured to disable the write clock signal, wherein reducing the frequency of the write clock signal by the control signal when the remaining data volume increases comprises:

comparing the remaining data volume with a plurality of different fifth threshold values; and when the remaining data volume increases to reach one of the plurality of fifth threshold values, increasing a pulse width of the control signal, wherein when the remaining data volume increases to reach a maximum one of the plurality of fifth threshold values, a duty cycle of the control signal is set to 100%, wherein reducing the frequency of the read clock signal by the control signal when the remaining data volume decreases comprises:

comparing the remaining data volume with a plurality of different sixth threshold values; and when the remaining data volume decreases to reach one of the plurality of sixth threshold values, increasing the pulse width of the control signal, wherein when the remaining data volume decreases to reach a minimum one of the plurality of sixth threshold values, the duty cycle of the control signal is set to 100%.

13. The method of claim 9, wherein the data transmitting device and the data receiving device belong to different clock domains.

14. The method of claim 9, wherein the data transmitting device and the data receiving device belong to a same clock domain, and the data transmitting device and the data receiving device conduct an asynchronous data transmission.

15. The method of claim 9, wherein computing the remaining data volume of the memory circuit comprises:

receiving a write pointer and a read pointer of the memory circuit; and subtracting the read pointer from the write pointer to obtain the remaining data volume.

16. The method of claim 9, wherein the memory circuit is a first-in-first-out (FIFO) memory circuit.

17. A buffer circuit, comprising:

a memory circuit, configured to store an input data from a data transmitting device, configured to transmit an output data to a data receiving device, and configured to receive a read-enable signal from the data receiving device; and a control circuit, configured to compute a remaining data volume of the memory circuit, and configured to generate a control signal having periodical pulses according to the remaining data volume, wherein the remaining data volume is indicative of a volume of data to be transmitted which are stored in the memory circuit, wherein the control signal is configured to control the data receiving device to generate a read clock signal, in response to the read-enable signal having a second logic level, the control circuit periodically disables a clock generating circuit of the data receiving device by the control signal from generating the read clock signal so as to gradually reduce a frequency of the read clock signal when the remaining data volume decreases from a first threshold value to a second threshold value, thereby gradually adjusting the frequency of the read clock signal from a third frequency to a forth frequency.

18. The buffer circuit of claim 17, wherein the control signal is configured to disable the data receiving device from generating the read clock signal, and the control circuit increases a duty cycle of the control signal when the remaining data volume decreases.

19. The buffer circuit of claim 17, wherein the memory circuit conducts a read operation to transmit the output data to the data receiving device according to the read clock signal of the data receiving device.

20. The buffer circuit of claim 17, wherein the control signal is configured to disable the data receiving device from generating the read clock signal, and the control circuit is configured to compare the remaining data volume with a plurality of different third threshold values, wherein the control circuit increases a pulse width of the control signal when the remaining data volume decrease to reach one of the plurality of third threshold values, wherein the control circuit sets a duty cycle of the control signal to 100% when the remaining data volume decreases to reach a minimum one of the plurality of third threshold values.

* * * * *